(12) United States Patent
Vimercati et al.

(10) Patent No.: US 7,554,861 B2
(45) Date of Patent: *Jun. 30, 2009

(54) MEMORY DEVICE WITH A RAMP-LIKE VOLTAGE BIASING STRUCTURE AND REDUCED NUMBER OF REFERENCE CELLS

(76) Inventors: Daniele Vimercati, Via M.L. King, 10, I-20048 Carate Brianza (MI) (IT); Efrem Bolandrina, Via Cedrali, 5, I-24020 Fiorano Al Serio (BG) (IT)

( * ) Notice: Subject to any disclaimer, the term of this patent is extended or adjusted under 35 U.S.C. 154(b) by 112 days.

This patent is subject to a terminal disclaimer.

(21) Appl. No.: 11/368,363

(22) Filed: Mar. 3, 2006

(65) Prior Publication Data

US 2006/0215463 A1    Sep. 28, 2006

(30) Foreign Application Priority Data

Mar. 3, 2005    (EP) .................................. 05101659

(51) Int. Cl.
G11C 7/06    (2006.01)
(52) U.S. Cl. .............................. 365/189.07; 365/189.06; 365/189.09
(58) Field of Classification Search ............ 365/189.07, 365/189.06, 189.09
See application file for complete search history.

(56) References Cited

U.S. PATENT DOCUMENTS

| | | | |
|---|---|---|---|
| 5,748,533 A * | 5/1998 | Dunlap et al. .......... | 365/185.19 |
| 5,933,366 A | 8/1999 | Yoshikawa | |
| 7,075,844 B2 * | 7/2006 | Pagliato et al. .............. | 365/207 |
| 7,345,905 B2 | 3/2008 | Pio et al. | |
| 7,359,246 B2 * | 4/2008 | Sforzin et al. .......... | 365/185.19 |
| 2003/0016572 A1 | 1/2003 | Pascucci | |
| 2006/0209594 A1 * | 9/2006 | Pio et al. ............... | 365/185.03 |

FOREIGN PATENT DOCUMENTS

| | | |
|---|---|---|
| EP | 1 233 422 A1 | 8/2002 |
| EP | 1 467 377 A1 | 10/2004 |
| EP | 1 505 605 A1 | 2/2005 |
| WO | WO 2004/013863 A1 | 2/2004 |

OTHER PUBLICATIONS

European Search Report for EP 05 10 1659.

* cited by examiner

*Primary Examiner*—Pho M. Luu
(74) *Attorney, Agent, or Firm*—Blakely, Sokoloff, Taylor & Zafman LLP

(57) ABSTRACT

A memory device is proposed. The memory device includes a plurality of memory cells, means for comparing a set of selected memory cells with at least one reference cell having a predefined threshold voltage, the means for comparing including biasing means for applying a biasing voltage having a substantially monotonic time pattern to the selected memory cells and the at least one reference cell, means for detecting the reaching of a comparison current by a measure cell current corresponding to each selected memory cell and by a measure reference current corresponding to each reference cell, and means for determining a condition of each selected memory cell according to a temporal relation of the reaching of the comparison current by the corresponding measure cell current and by the at least one measure reference current, wherein the means for comparing further includes means for selectively modifying at least one of said currents to emulate the comparison with at least one further reference cell having a further threshold voltage.

19 Claims, 11 Drawing Sheets

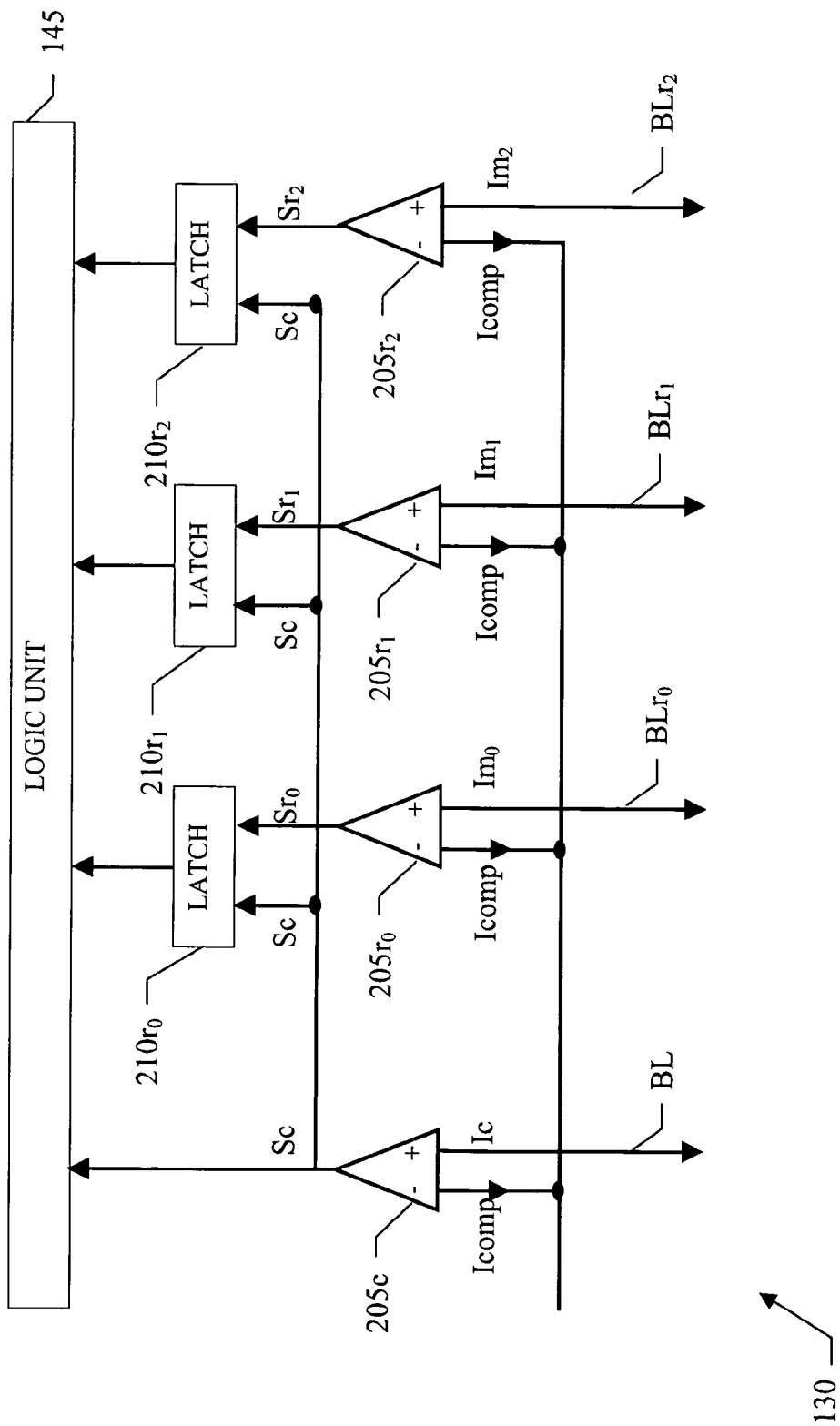

MEMORY DEVICE WITH A RAMP-LIKE VOLTAGE BIASING STRUCTURE AND REDUCED NUMBER OF REFERENCE CELLS

PRIORITY CLAIM

This application claims priority from European patent application No. EP05101659.0, filed Mar. 3, 2005, which is incorporated herein by reference.

TECHNICAL FIELD

An embodiment of the present invention relates to the memory field. More specifically, the embodiment of the present invention relates to the reading of memory devices.

BACKGROUND

Memory devices are commonly used to store information (either temporarily or permanently) in a number of applications; for example, in a non-volatile memory device the information is preserved even when a power supply is off. Typically, the memory device includes a matrix of memory cells (for example, consisting of floating gate MOS transistors); each memory cell has a threshold voltage that can be programmed to different levels representing corresponding logical values. Particularly, in a multi-level memory device each cell can take more than two levels (and then store a plurality of bits).

The logical values stored in selected cells of the memory device are read by comparing a current flowing through each memory cell with the currents provided by reference cells in predefined conditions. For this purpose, a suitable biasing voltage is applied to the selected memory cells and to the reference cells.

A different technique is disclosed in EP-A-1467377 (the entire disclosure of which is herein incorporated by reference). This document proposes the use of a biasing voltage having a monotonic time pattern; preferably, the waveform of the biasing voltage consists of a ramp, which increases linearly over time with a constant slope. In this case, each selected memory cell and the reference cells turn on at different times (as soon as the biasing voltage reaches their threshold voltages). The temporal order of the turning on of the memory cell with respect to the ones of the reference cells uniquely identifies the logical value stored therein. In this way, the precision of the reading operation is strongly improved and made independent of most external factors.

Similar considerations apply to a program verify operation, which is typically performed to verify the correct programming of selected memory cells. For this purpose, each selected memory cell is compared with a further reference cell having a threshold voltage slightly higher than the one corresponding to the target logical value (so as to ensure that the memory cell has been brought to the desired condition with a high degree of confidence).

A problem of some memory devices known in the art is the possible incorrect setting of the several reference cells. Indeed, the difference between the threshold voltages of each pair of adjacent reference cells typically must be maintained at a predefined value with a very high accuracy, since any drift reduces a window that is available to discriminate the corresponding conditions of the selected memory cells. This problem is particularly acute for each reference cell used for the read operation and the corresponding reference cell used for the program-verify operation; indeed, in this case the difference between the two threshold voltages is very low (for example, of the order of 80-110 mV).

Therefore, the setting of the reference cells typically requires a very accurate trimming of their threshold voltages. This increases the production time of the memory devices, with a detrimental impact on their costs.

SUMMARY

According to an embodiment of the present invention, the idea of using the available reference cells to emulate further reference cells having different threshold voltages is suggested.

Particularly, an embodiment of the present invention proposes a memory device including a plurality of memory cells. Means is provided for comparing a set of selected memory cells with one or more reference cells (having predefined threshold voltages). The means for comparing includes biasing means for applying a biasing voltage (having a substantially monotonic time pattern) to the selected memory cells and to the reference cells. The memory device further includes means for detecting the reaching of a comparison current by a measure cell current corresponding to each selected memory cell and by a measure reference current corresponding to each reference cell. Moreover, means is provided for determining a condition of each selected memory cell according to a temporal relation of the reaching of the comparison current by the corresponding measure cell current and by the measure reference currents. The means for comparing further includes means for selectively modifying at least one of said currents to emulate the comparison with one or more further reference cells having further threshold voltages.

The proposed embodiment strongly simplifies the setting of the reference cells.

Indeed, it is possible to emulate a reference cell from an available one with a well-defined difference in their threshold voltages. This embodiment obtains the desired windows for discriminating the different conditions of the memory cells with a very high degree of accuracy.

As a result, it is possible to reduce the number of reference cells that are needed with a corresponding simplification of their trimming.

This has a beneficial effect on the testing time of the memory device and on its cost.

The different embodiments of the invention described in the following may provide additional advantages.

For example, in a first embodiment of the invention the means for biasing includes means for applying a biasing current to a common node, from which a set of first paths (each one including a corresponding selected memory cell) and a second path (including the reference cells) branch.

In this case, the desired result can be achieved by unbalancing an equivalent resistance of the two paths.

In addition or in alternative, it is possible to unbalance an equivalent capacitance of the two paths.

In a further embodiment of the invention, the same result is achieved by delaying the application of the biasing voltage to the reference cells.

A way to improve the solution is to delay an enabling signal of the biasing means.

This allows operating at the digital level with a very high accuracy.

In another embodiment of the invention, each measured reference current is obtained by combining a current flowing through the corresponding reference cell with an adjusting current.

In a different embodiment of the invention, the desired result is achieved by updating the comparison current.

Without detracting from its general applicability, the means for selectively modifying is disabled during a read operation and enabled during one or more read operation with a margin.

The proposed feature allows obtaining the desired difference in the corresponding threshold voltages with high accuracy using a single reference cell.

Another embodiment of the present invention provides a corresponding method for operating a memory device.

BRIEF DESCRIPTION OF THE DRAWINGS

Embodiments of the invention itself, as well as further features and advantages thereof, will be best understood by reference to the following detailed description, given purely by way of a non-restrictive indication, to be read in conjunction with the accompanying drawings, in which:

FIG. 2a details an exemplary implementation of a sense amplifier of the memory device of FIG. 1;

FIG. 2b is an illustrative time diagram explaining operation of the sense amplifier of FIG. 2a;

DETAILED DESCRIPTION

Figure 1:
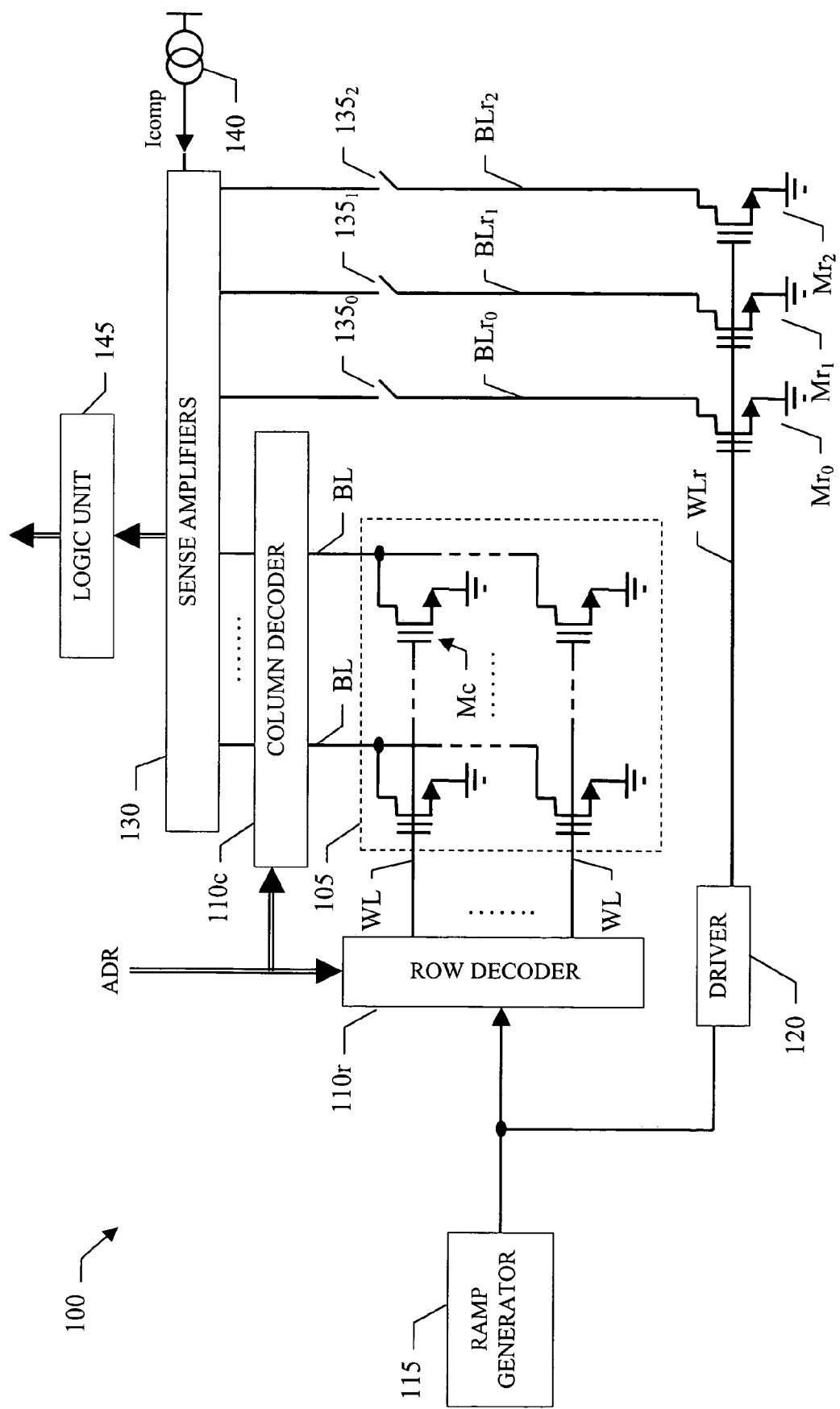
FIG. 1 is a schematic block diagram of a memory device in which a solution according to an embodiment of the invention can be used.

With reference in particular to FIG. 1, a non-volatile memory device 100 (for example, a flash $E^2PROM$) is illustrated. The memory device 100 is integrated in a chip of semiconductor material, and includes a matrix 105 of memory cells Mc. Each memory cell Mc includes a floating gate MOS transistor with a programmable threshold voltage Vthc. The memory cell Mc in a non-programmed (or erased) condition exhibits a low threshold voltage. The memory cell Mc is programmed by injecting electric charge into its floating gate; the memory cell Mc can be programmed to multiple levels, each one associated with a corresponding range of the threshold voltage Vthc. Each level represents a different logical value; for example, the memory device 100 operates at four levels, so that each memory cell Mc stores a logical value having two bits of information (11, 10, 01 and 00 for increasing threshold voltages Vthc).

The matrix 105 includes one or more sectors (only one shown in the figure), which can be erased individually. Each sector is associated with three reference cells $Mr_0$, $Mr_1$ and $Mr_2$ that are used for discriminating the logical values stored in the memory cells Mc. For this purpose, the threshold voltages of the reference cells $Mr_0$, $Mr_1$ and $Mr_2$ (denoted with $Vthr_0$, $Vthr_1$ and $Vthr_2$) are set to predefined values between the levels of the logical values 11-10, 10-01 and 01-00, respectively.

In the example at issue, the matrix 105 has a so-called NOR architecture. Particularly, the drain terminals of the memory cells Mc of each column are connected to a corresponding bit line BL, whereas the control gate terminals of the memory cells Mc of each row are connected to a corresponding word line WL; the source terminals of all the memory cells Mc are connected to a common terminal providing a reference voltage (or ground).

The memory device 100 simultaneously processes a word (for example, having sixteen bits). The bits of each word are stored in a page of memory cells Mc (16/2=8 memory cells Mc per word in the example at issue), which are associated with a single word line WL; the bit lines BL of the matrix 105 are grouped into eight sub-sets, each one for the memory cells Mc (placed on the same column) of the different pages.

Likewise, the drain terminals of the reference cells $Mr_0$, $Mr_1$ and $Mr_2$ are connected to a bit line $BLr_0$, $BLr_1$ and $BLr_2$, respectively. The control gate terminals of all the reference cells $Mr_0$, $Mr_1$ and $Mr_2$ are connected to a common word line WLr, whereas their source terminals are connected to the ground terminal.

The memory device 100 receives an address ADR for accessing a corresponding page. A portion of the address ADR is supplied to a row decoder 110r, which selects the desired word line WL. Another portion of the address ADR is supplied to a column decoder 110c, which selects the desired bit line BL in each sub-set.

The row decoder 110r couples the selected word line WL with a ramp generator 115. The ramp generator 115 applies a suitable biasing voltage to the control gate terminals of the selected memory cells Mc. The same biasing voltage is also applied to the control gate of the reference cells $Mr_0$, $Mr_1$ and $Mr_2$ through a driver 120. As it will be apparent in the following, the biasing voltage has a ramp-like pattern, with its value that increases linearly over time according to a constant slope.

The column decoder 110c connects the selected bit lines BL to a bank of sense amplifiers 130. The sense amplifiers 130 are also connected to the bit lines $BLr_0$, $BLr_1$ and $BLr_2$ through switches $135_0$, $135_1$ and $135_2$, respectively. Moreover, the sense amplifiers 130 receive a comparison current Icomp; the comparison current Icomp is provided by a current generator 140, and has a value lower than the current flowing through every (memory or reference) cell Mc, $Mr_0$-$Mr_2$ when conductive. As described in detail in the following, the sense amplifiers 130 compare the currents corresponding to the selected memory cells Mc and to the reference cells $Mr_0$-$Mr_2$ with the current Icomp, so as to detect their turning on. This information is supplied to a logic unit 145, which determines the logical value stored in each selected memory cell Mc according to the temporal relation of the relevant turning on times.

Considering now FIG. 2a, the sense amplifiers 130 include the same structure for each selected memory cell; particularly, this structure is formed by a comparator 205c for the memory cell and three comparators $205r_0$, $205r_1$ and $205r_2$ for the reference cells. The non-inverting input terminal of the comparator 205c receives a cell current Ic flowing through the selected bit line BL (and then through the desired memory cell to be read); on the other hand, the non-inverting input terminals of the comparators $205r_0$, $205r_1$ and $205r_2$ receive a measure reference current $Im_0$, $Im_1$ and $Im_2$ corresponding to the bit lines $BLr_0$, $BLr_1$ and $BLr_2$, respectively. The inverting input terminals of all the comparators 205c, $205r_0$-$205r_2$ instead receive the comparison current Icomp.

The comparators $205c$, $205r_0$, $205r_1$ and $205r_2$ output a conduction bit Sc, $Sr_0$, $Sr_1$ and $Sr_2$, respectively, which is asserted (for example, at the logical value 1) when the corresponding currents Ic, $Im_0$, $Im_1$ and $Im_2$ exceed the comparison current Icomp.

Three latches $210r_0$, $210r_1$ and $210r_2$ receive the conduction bits $Sr_0$, $Sr_1$ and $Sr_2$, respectively. The latches $210r_0$-$210r_2$ are controlled by the conduction bit Sc (provided by the comparator $205c$); particularly, when the conduction bit Sc is asserted, the conduction bits $Sr_0$, $Sr_1$ and $Sr_2$ are stored into the latch $210r_0$, $210r_1$ and $210r_2$, respectively. The conduction bits $Sr_0$-$Sr_2$ stored in the latches $210r_0$-$210r_2$ are then supplied to the logic unit 145.

Figure 2B:
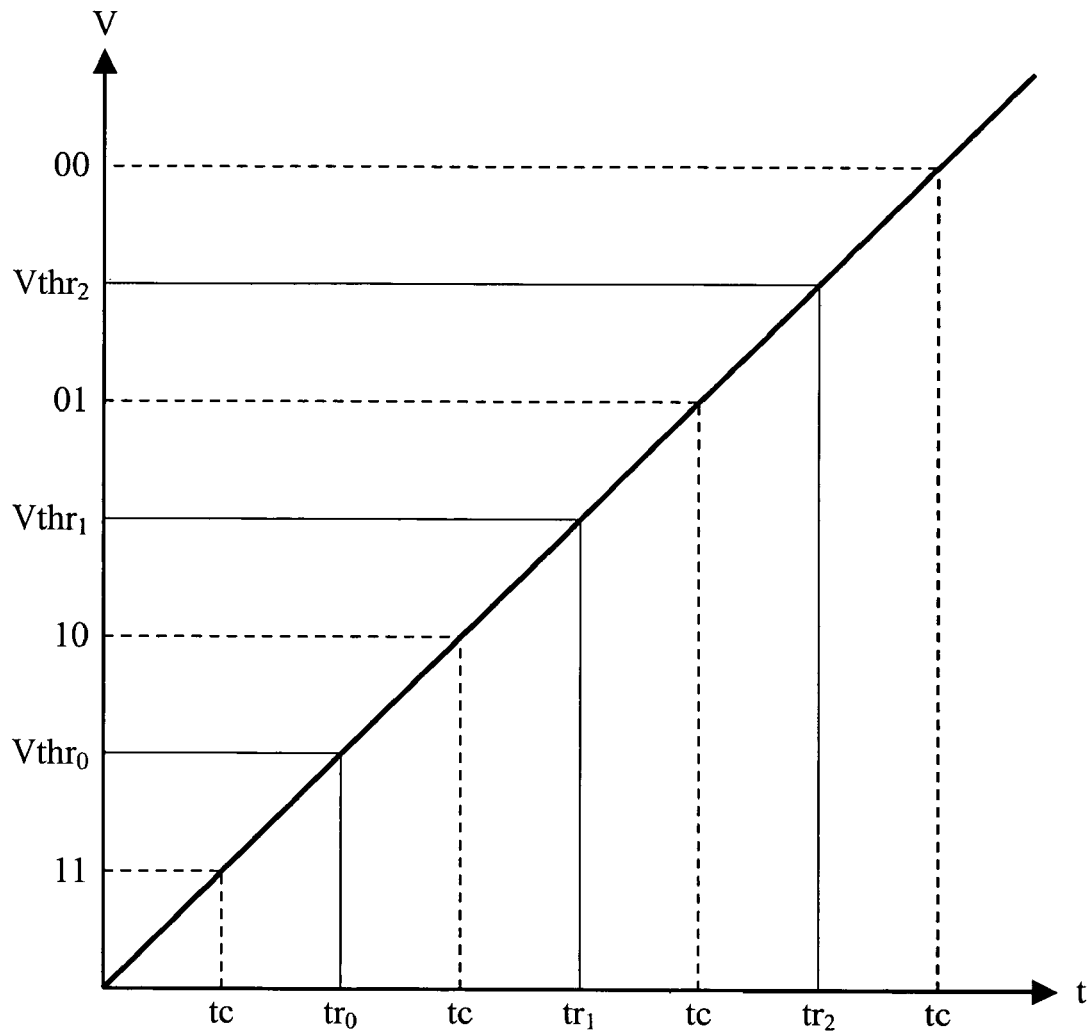

As shown in FIG. 2b, the biasing voltage (V) increases over time (t) from the value 0V to a maximum value higher than the threshold voltage $Vthr_2$ (of the last reference cell $Mr_2$). When the biasing voltage reaches the threshold voltage $Vthr_0$ at the time $tr_0$, the reference cell $Mr_0$ turns on; therefore, as soon as the corresponding measure reference current $Im_0$ reaches the comparison current Icomp, its conduction bit $Sr_0$ is asserted. The other conduction bits $Sr_1$ and $Sr_2$ are asserted in succession when the biasing voltage reaches the threshold voltage $Vthr_1$ at the time $tr_1$ and the threshold voltage $Vthr_2$ at the time $tr_2$, respectively.

Likewise, the conduction bit Sc is asserted when the biasing voltage reaches the threshold voltage Vthc of the memory cell to be read at the time tc. As a result, the current values of the conduction bits $Sr_0$-$Sr_2$ are stored into the corresponding latches $210r_0$-$210r_2$; the conditions of the latches $210r_0$-$210r_2$ when the conduction bit Sc is asserted uniquely identify the logical value stored in the memory cell. Particularly, if the time tc precedes the time $tr_0$ all the values in the latches $210r_0$-$210r_2$ are deasserted; this means that the threshold voltage Vthc is lower than the threshold voltage $Vthr_0$ and the memory cell stores the logical value 11. In a similar manner, if the time tc is comprised between the times $tr_0$-$tr_1$ (value in the latch $210r_0$ asserted and values in the latches $210r_1$-$210r_2$ deasserted) or the times $tr_1$-$tr_2$ (values in the latches $210r_0$-$210r_1$ asserted and value in the latch $210r_2$ deasserted) the memory cell stores the logical values 10 or 01, respectively. If the time tc follows the time $tr_2$ (all the values in the latches $210r_0$-$210r_2$ asserted) or the conduction bit Sc is not asserted when the biasing voltage reaches its maximum value (higher than the threshold voltage $Vthr_2$), the memory cell stores the logical value 00. It should be noted that once the conduction bit Sc has switched (and the values of the conduction bits $Sr_0$-$Sr_2$ have been stored into the corresponding latches $210r_0$-$210r_2$), the memory and reference cells can be turned off by means of the column decoder and the associated switches, respectively (so as to reduce the power consumption of the memory device and any noise caused by the current drained from the common ground terminal). Similar considerations apply if the conduction bit Sr is stored into all the latches $210r_0$-$210r_2$ in response to the respective conduction bits $Sr_0$-$Sr_2$.

Figure 3A:
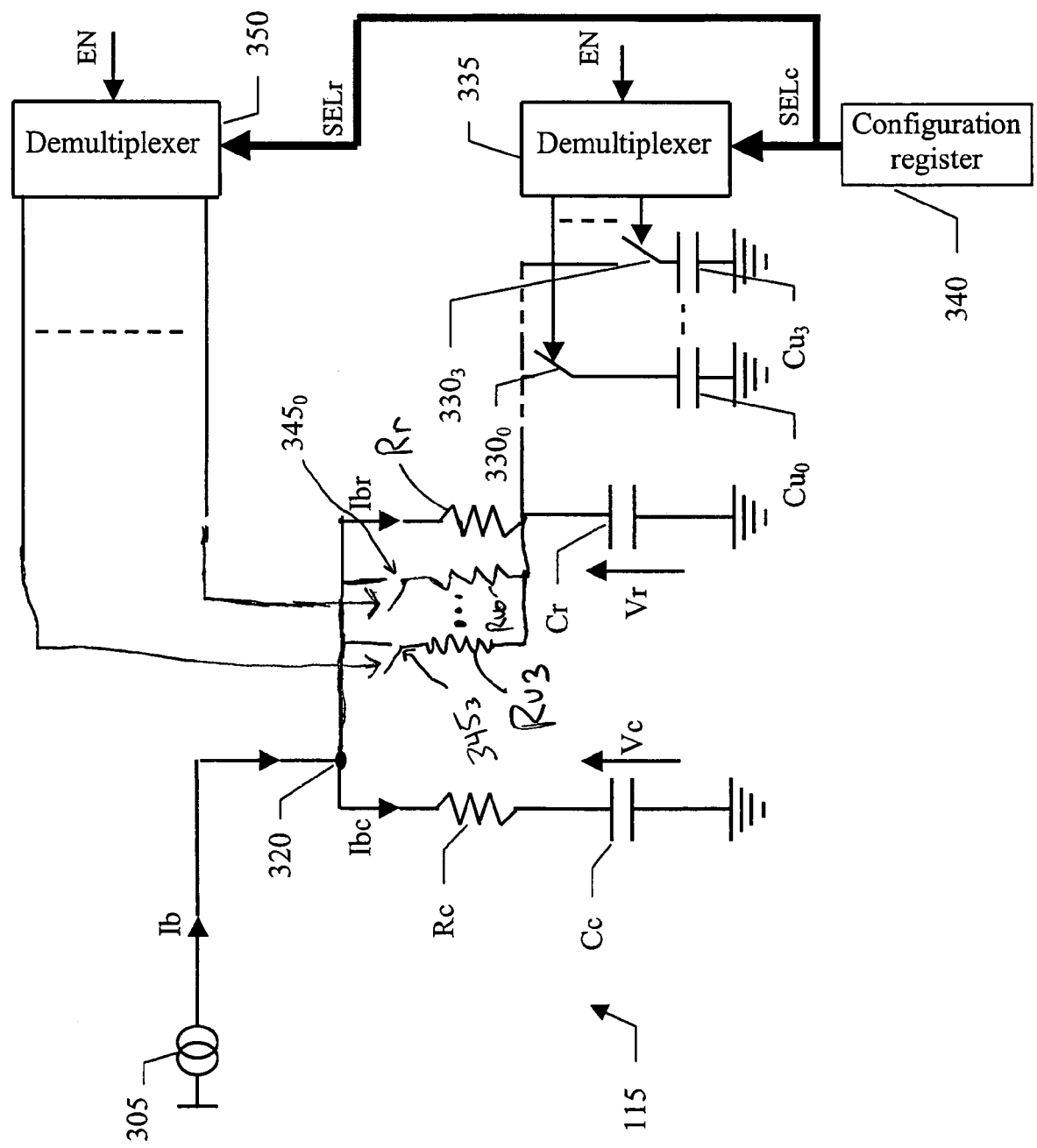
FIG. 3a is a schematic representation of a first embodiment of the invention.

Moving to FIG. 3a, in a first embodiment of the invention the ramp generator 115 is formed by a current generator 305 that provides a direct biasing current Ib. Preferably, additional trimming current generators (not shown in the figure) are used to regulate the biasing current Ib to the desired value (either adding or subtracting corresponding correction currents, when enabled).

The biasing current Ib is applied to a common node 320, from which a path including the selected memory cell and a path including the reference cells branch. In order to explain operation of the ramp generator 115, the selected memory cell is represented by an equivalent capacitor Cc connected in series to an equivalent resistor Rc (through which a corresponding biasing current Ibc flows); the capacitor Cc represents the stray capacitance of the selected memory cell, whereas the resistor Rc represents the intrinsic resistance of the row decoder. Likewise, the reference cells are represented by an equivalent capacitor Cr connected in series to an equivalent resistor Rr (through which a corresponding biasing current Ibr flows); the capacitor Cr represents the stray capacitance of the reference cells, whereas the resistor Rr represents the intrinsic resistance of the corresponding driver. The driver also includes a dummy capacitor and a dummy resistor (not shown in the figure), which are used to equalize the capacitor Cr and the resistor Rr with the capacitor Cc and the resistor Rc, respectively; preferably, additional trimming capacitors and resistors are used to regulate the equivalent capacitance and resistance of the path including the reference cells to the desired value.

A plurality of unbalancing capacitors Cuj (for example, with j=0 . . . 3) are connected in parallel to the capacitor Cr by means of corresponding switches $330j$; each unbalancing capacitor Cuj accordingly increases the equivalent capacitance of the path including the reference cells (when the corresponding switch $330j$ is closed). The switches $330j$ are driven by a demultiplexer 335. The demultiplexer 335 receives an enabling signal EN (from a control unit of the memory device, not shown in the figure) and a select signal SELc; the select signal SELc is stored in a corresponding portion of a configuration register 340. Likewise, a plurality of unbalancing resistors Ruj are connected in parallel to the resistor Rr by means of corresponding switches $345j$; each unbalancing resistor Ruj accordingly decreases the equivalent resistance of the path including the reference cells (when the corresponding switch $345j$ is closed). The switches $345j$ are driven by a demultiplexer 350. The demultiplexer 350 receives the same enabling signal EN and a select signal SELr (which is stored in a corresponding portion of a configuration register 340).

Figure 3B:
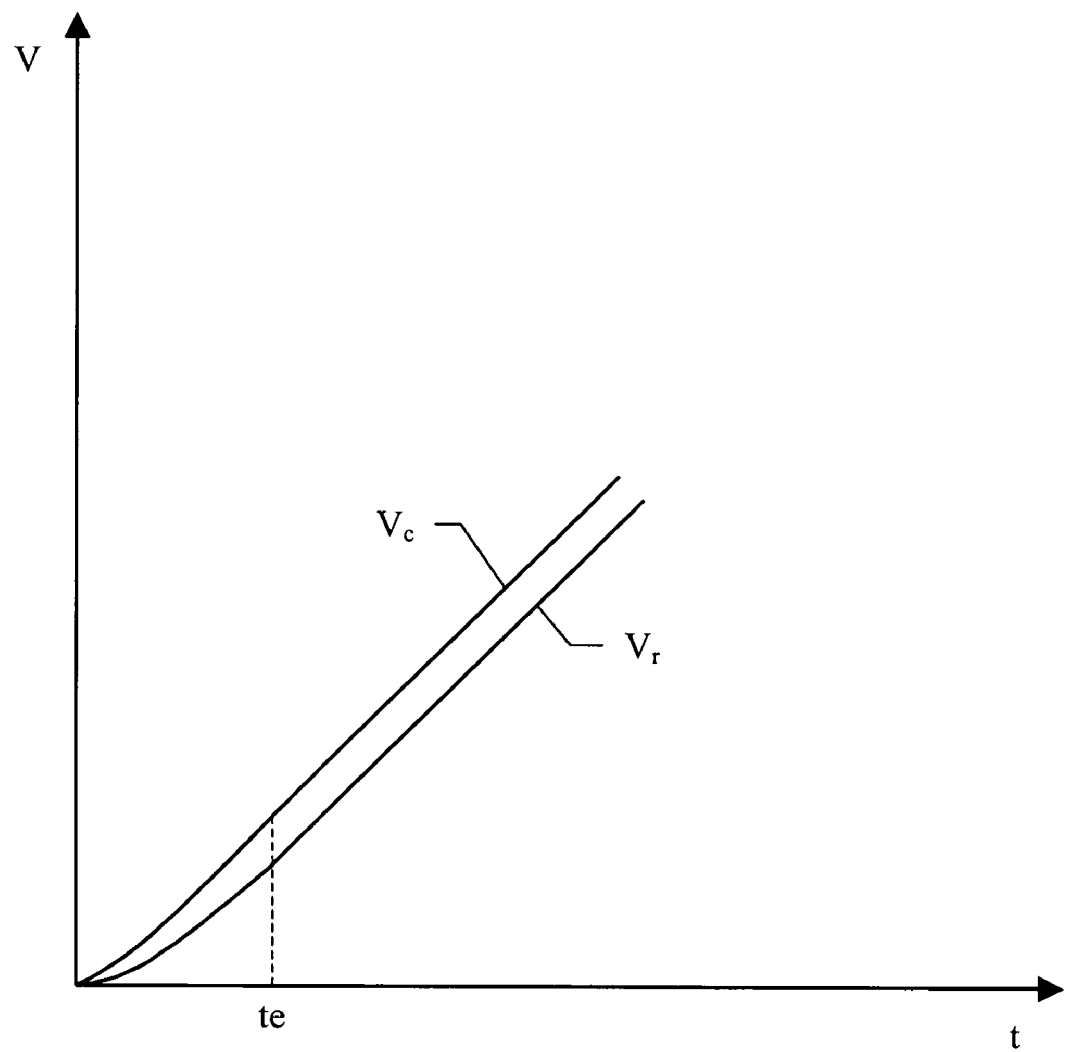
FIG. 3b is an illustrative time diagram explaining operation of the first embodiment of the invention.

Considering now FIGS. 3a and 3b together, as soon as the ramp generator 115 is enabled the biasing current Ib starts charging the equivalent capacitor of the path including the memory cell (Cc) and the equivalent capacitor of the path including the reference cells Cr. In this phase, the biasing current Ib splits between the two paths according to their time constants. As a result, the corresponding voltages (Vc and Vr, respectively) increase with quadratic laws.

An equilibrium condition is reached (at a time te) when the biasing currents Ibc and Ibr become constant. From now on, the voltages Vc and Vr increase linearly according to the following expressions (in the following, the values of the electrical quantities are denoted with the same symbols used to identify the corresponding components in the figures):

$$\frac{Ibc}{Cc} = \frac{dVc}{dt} = Sc$$

$$\frac{Ibr}{Ceq} = \frac{dVr}{dt} = Sr$$

where Sc and Sr are the constant slopes of the cell voltage Vc and of the reference voltage Vr, respectively.

In this condition, the slopes Sc and Sr always have the same value. Indeed, we have that:

$$Rc \cdot Ibc + Vc = Rr \cdot Ibr + Vr$$

and then:

$$Rc \cdot Sc \cdot Cc + Vc = Rr \cdot Sr \cdot Cr + Vr$$

By taking the derivative of both terms with respect to the time, we obtain (being Rc, Sc, Cc and Rr, Sr, Cr constant in any specific condition):

$$\frac{dVc}{dt} = \frac{dVr}{dt}$$

that is:

$$Sc = Sr$$

Therefore, denoting with Sb=Sc=Sr the common slope and with Cb=Cc+Cr the total capacitance of the two paths, we have:

$$Ib = Ibc + Ibr = Sb \cdot Cc + Sb \cdot Cr = Sb \cdot Cb$$

During a read operation, the enabling signal EN is deasserted; therefore, all the switches 330j, 345j are open. In this condition, the two paths have the same equivalent capacitance and the same equivalent resistance. As a result, the voltages Vr and Vc change with the same identical law over time.

Conversely, during a program-verify operation the enabling signal EN is asserted; therefore, the switches 330j and 345j are closed according to the selection signals SELc and SELr, respectively. This causes an unbalancing of the equivalent capacitance and/or of the equivalent resistance of the path including the reference cells (denoted with Cru and Rru, respectively) with respect to the capacitance Cc and to the resistance Rc.

This mismatch of the elements Rc,Cc and Rru,Cru causes a temporal translation of the corresponding voltages Vc and Vr (without affecting their slopes). Indeed, the corresponding voltages Vc and Vr now increase with different quadratic laws at the beginning (before reaching the desired constant slope). Denoting with Vb the voltage between the common node 320 and the ground terminal we have:

$$Vc = Vb - Rc \cdot Ibc =$$
$$Vb - Rc \cdot Sb \cdot Cc = Vb - \frac{Rc \cdot Ib \cdot Cc}{Cb} = Vb - \frac{Rc \cdot Cc \cdot Ib}{Cc + Cru}$$

and likewise:

$$Vr = Vb - \frac{Rru \cdot Cru \cdot Ib}{Cc + Cru}$$

Therefore, the difference between the cell voltage Vc and the reference voltage Vr is:

$$\Delta V = Vc - Vr =$$

-continued $$Vb - \frac{Rc \cdot Cc \cdot Ib}{Cc + Cru} - Vb + \frac{Rru \cdot Cru \cdot Ib}{Cc + Cru} = \frac{Ib(Rru \cdot Cru - Rc \cdot Cc)}{Cc + Cru}$$

This difference of the biasing voltage Vr is equivalent to a corresponding difference (of opposite sign) in the threshold voltage of the reference cells. Indeed, the biasing voltage Vr now reaches the threshold voltage of each reference cell later (when the biasing voltage Vr is lower) or in advance (when the biasing voltage is higher). Therefore, the corresponding measure reference current will be delayed or advanced accordingly.

It should be noted that the above-described solution is applicable even if the capacitors Cc and Cr (and/or the resistors Rc and Rr) do not match perfectly when the enabling signal EN is deasserted. Indeed, the corresponding difference between the voltages Vc and Vr does not adversely affect the correctness of the reading operation, since the same difference is also present during the program-verify operation; therefore, this difference cancels when the memory cells are subsequently read. The only effect of any mismatch of the elements Rc, Cc and Rr, Cr is a corresponding reduction of a voltage window that is available for storing the desired logical values.

Figure 4A:
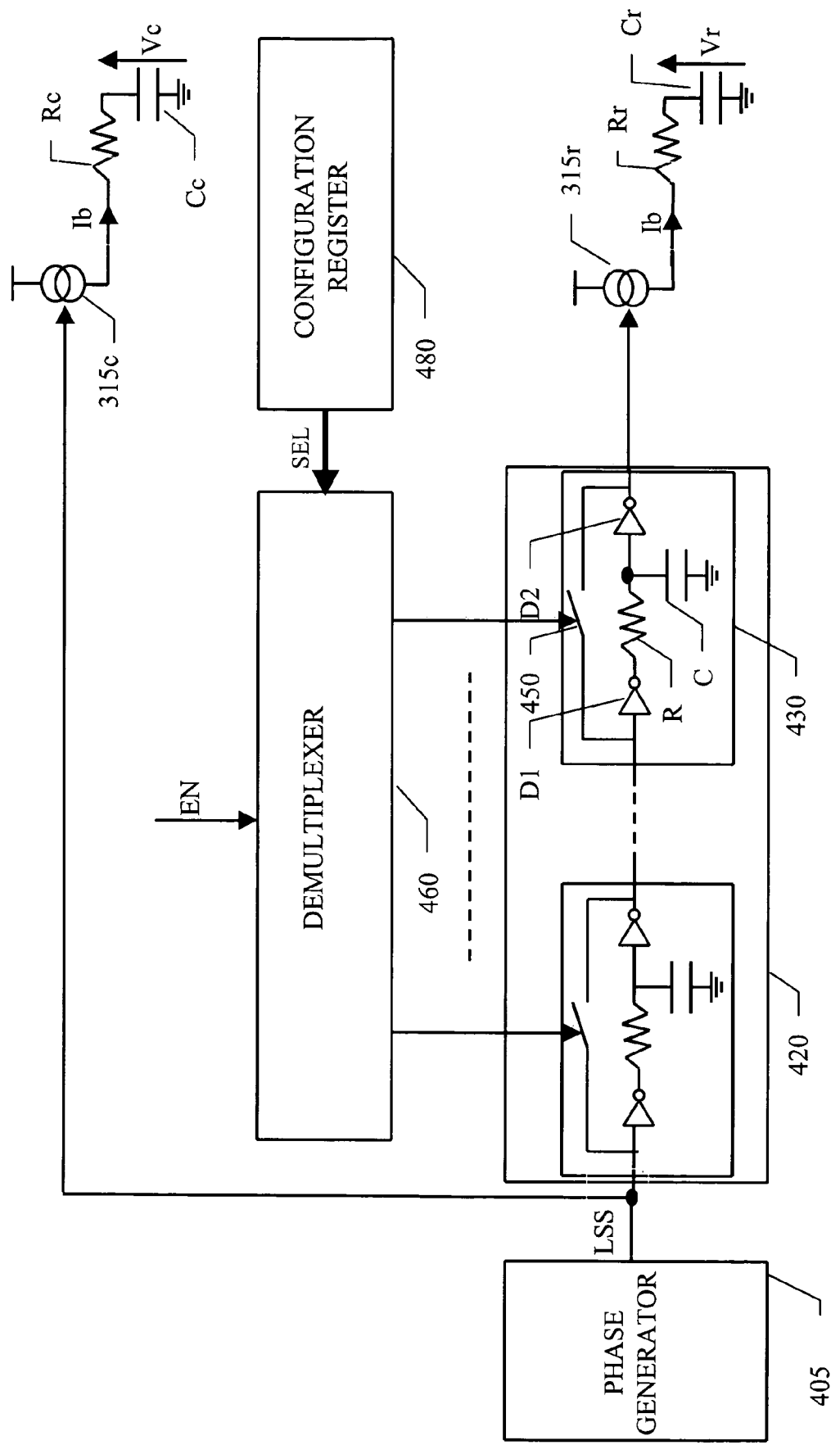
FIG. 4a is a schematic representation of a second embodiment of the invention.

Considering now FIG. 4a, a further embodiment of the invention is represented (the elements corresponding to the ones shown in the preceding figures are denoted with the same references, and their explanation will be omitted for the sake of brevity).

In this case, a phase generator 405 provides a logic start signal LSS for any read or program-verify operation. The logic start signal LSS directly controls a direct current generator 315c (similar to the one described above), which supplies the desired biasing current Ib to the path including the memory cell (represented by the equivalent capacitor Cc and the equivalent resistor Rc).

Conversely, a further direct current generator 315r supplying the same biasing current Ib to the path including the reference cells (represented by the equivalent capacitor Cr and the equivalent resistor Rr, with Cr=Cc and Rr=Rc) is controlled by the logic start signal LSS through a delay block 420. The delay block 420 is formed by a plurality of basic delay blocks 430 that are connected in series. Each basic delay block 430 includes an inverter D1; the inverter D1 has an input terminal connected to a previous basic delay block 430 (with the first one that receives the start signal LSS), and an output terminal connected to a first terminal of a resistor R. The resistor R has the other terminal connected to a first terminal of a capacitor C, which has the other terminal connected to the ground terminal. The common node between the resistor R and the capacitor C is connected to an input terminal of a further inverter D2. The output terminal of the inverter D2 is connected to the next basic delay block 430 (with the last one that controls the current generator 315r). The input terminal of the inverter D1 and the output terminal of the inverter D2 are connected to each other through a switch 450. The switch 450 is driven by a corresponding signal provided by a demultiplexer 460. The demultiplexer 460 receives the same enabling signal EN as in the preceding case, and a select signal SEL, which is stored in a configuration register 480.

Each basic delay block 430 introduces a corresponding delay for the logic start signal LSS (for example, 0.5 ns) when the corresponding switch 450 is open; conversely, when the switch 450 is closed, the basic delay block 430 is short-circuited and then does not affect the transmission of the logic start signal LSS. Therefore, the logic start signal LSS will be applied to the current generator 315r with a total delay equal to the number of the basic delay blocks 430 that are enabled (i.e., with the corresponding switches 450 open).

Figure 4B:
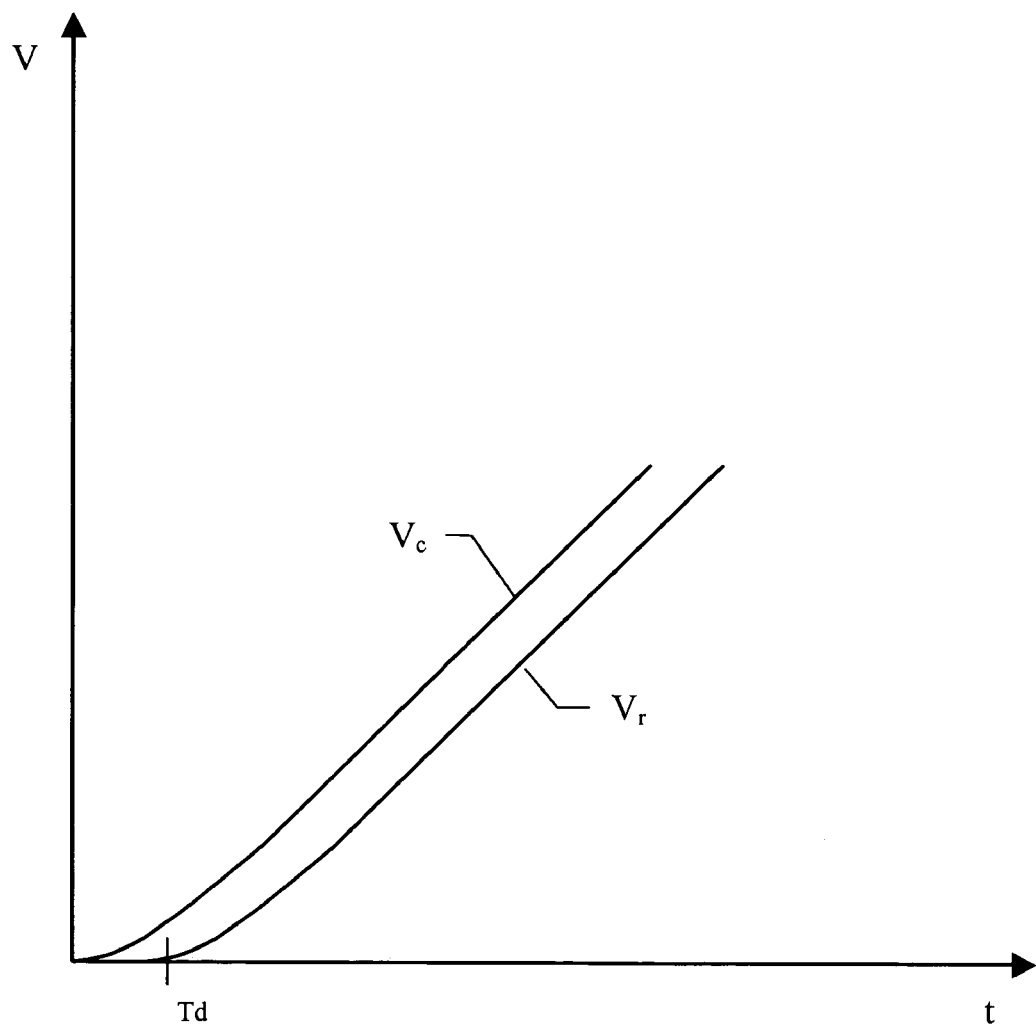
FIG. 4b is an illustrative time diagram explaining operation of the second embodiment of the invention.

Considering now FIGS. 4a and 4b together, as soon as the logic start signal LSS is asserted the ramp generator 315c is enabled; therefore, as described above the voltage Vr increases with the desired constant slope (after a transient period).

During the read operation, the enabling signal EN is deasserted; as a result, all the switches 450 are closed. In this condition, also the ramp generator 315r is immediately enabled by the start signal LSS, so that the voltage Vr will increase with the same identical law as the voltage Vc.

Conversely, during the program-verify operation the enabling signal EN is asserted; therefore, the switches 450 are opened according to the selection signal SEL. This causes a corresponding delay in the enabling of the current generator 315r (denoted with Td in FIG. 4b).

This delay causes a temporal translation of the voltage Vr (without affecting its wave-form). In this case as well, the difference of the biasing voltage Vr is equivalent to a corresponding difference (of opposite sign) in the threshold voltage of the reference cells. Indeed, the biasing voltage Vr now reaches the threshold voltage of each reference cell with the delay Td and then the corresponding measure reference current will be delayed accordingly.

Figure 5A:
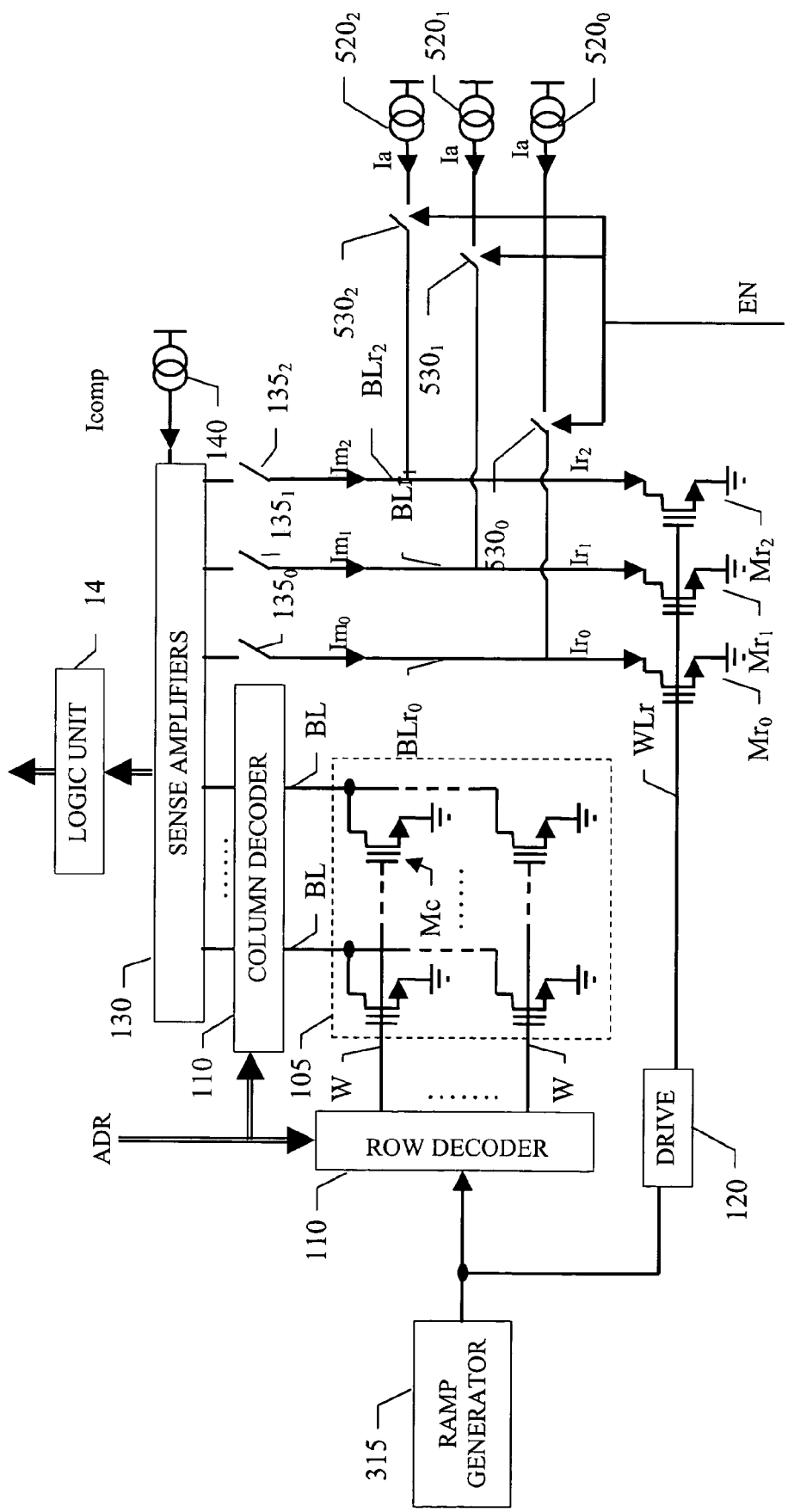
FIG. 5a is a schematic representation of a third embodiment of the invention.

Moving to FIG. 5a, in a third embodiment of the present invention an adjusting current generators $520_i$ is provided for each reference cell $Mr_i$. The adjusting current generator $520_i$ is connected to the corresponding bit line $BLr_i$ by means of a corresponding switch $530_i$, which is controlled by the same enabling signal EN. The current generator $520_i$ sources an adjusting current Ia to the corresponding bit line $BLr_i$ (when its switch $530_i$ is close); preferably, additional trimming current generators (not shown in the figure) are used to regulate the adjusting current Ia to the desired value (either increasing or decreasing it when enabled). Therefore, each measure reference current $Im_i$ (being supplied to the sense amplifiers 130) will be equal to a combination of a reference current $Ir_i$ flowing through the corresponding reference cell $Mr_i$ with the adjusting current Ia (when enabled).

Figure 5B:
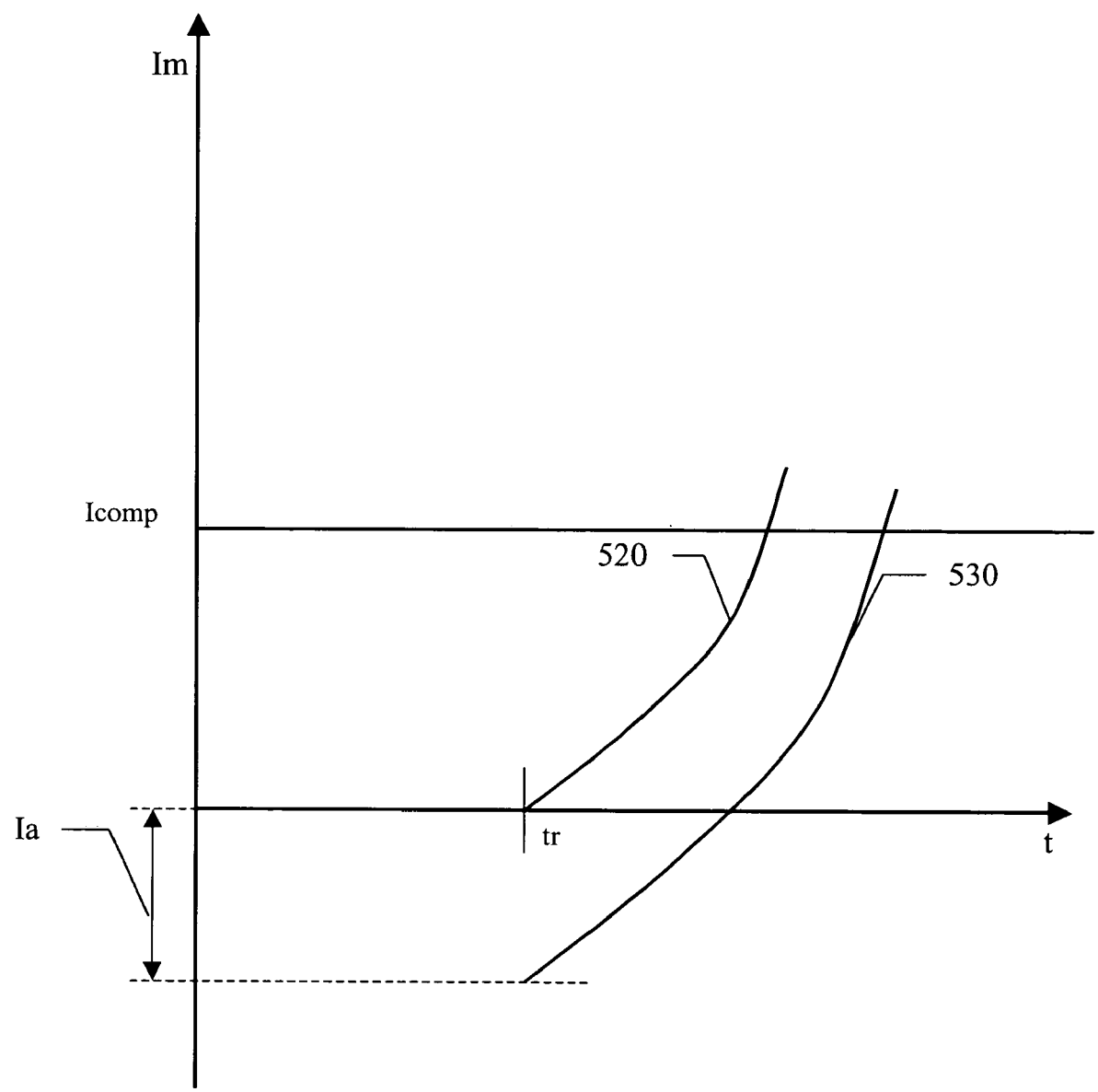
FIG. 5b is an illustrative time diagram explaining operation of the third embodiment of the invention.

Considering now FIGS. 5a and 5b together, the operation of the above-described structure is described with respect to a generic reference cell (for the sake of simplicity, the corresponding indexes will be omitted in the following).

During the read operation, the enabling signal EN is deasserted; as a result, the switch 530 is open. In this condition, the measure reference current Im is equal to the reference current Ir. Therefore, when the biasing voltage reaches the threshold voltage of the reference cell at the time tr, the reference cell turns on; therefore, as soon as the measure reference current Im=Ir reaches the comparison current Icomp, its conduction bit is asserted.

Conversely, during the program-verify operation the enabling signal EN is asserted; therefore, the switch 530 is closed. As a result, the adjusting current Ia is sourced to the bit line BLr, so that Im=Ir−Ia. This causes a corresponding delay in the reaching of the comparison current Icomp by the measure reference current Im; the delay is equivalent to an increase of the threshold voltage of the reference cell. Similar considerations apply if the adjusting current is injected into the bit line.

Figure 6A:
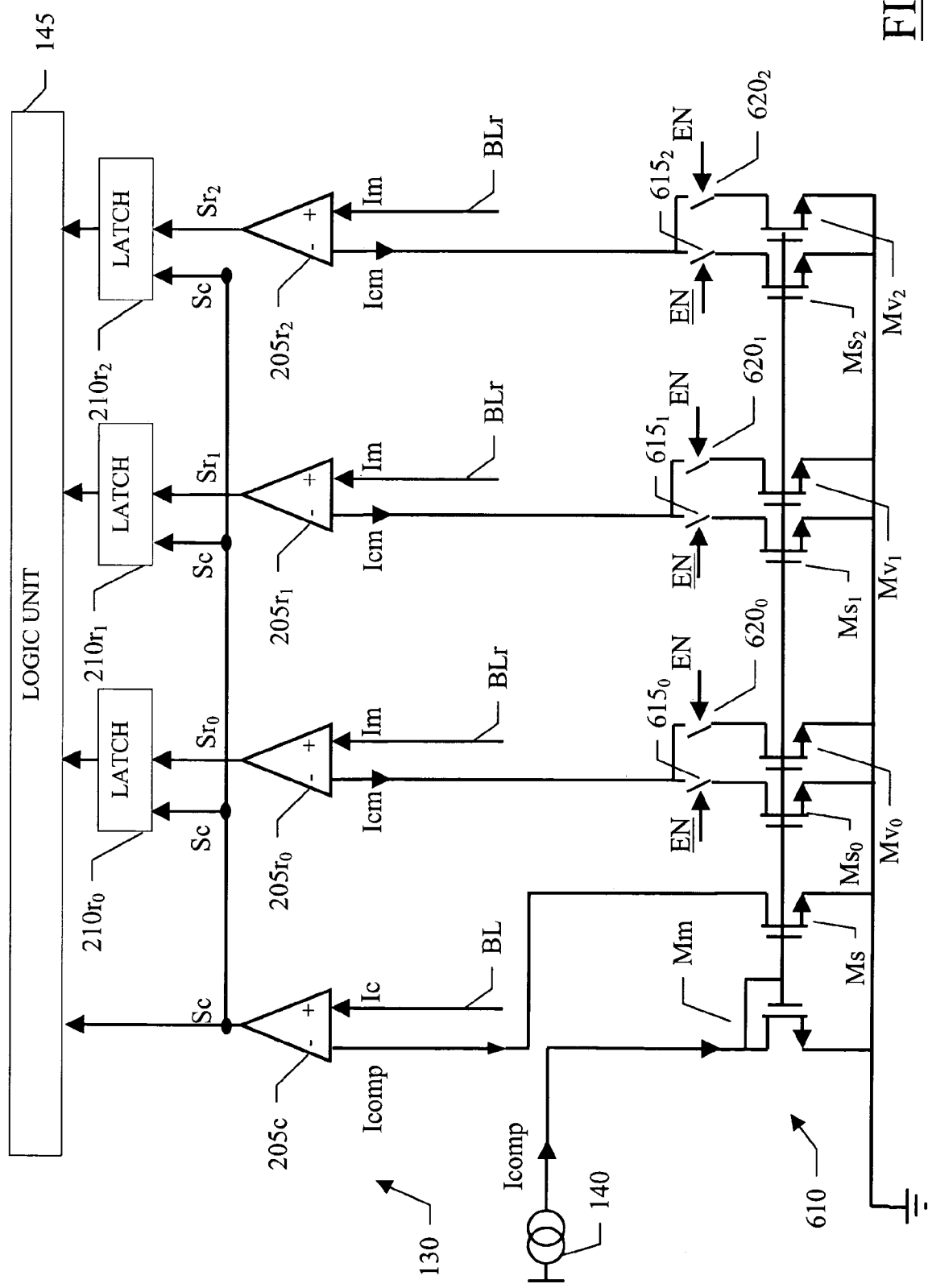
FIG. 6a is a schematic representation of a fourth embodiment of the invention.

With reference now FIG. 6a, in a fourth embodiment of the invention the comparison current is provided to the sense amplifiers 130 through a current mirror 610. The current mirror 610 includes an input leg that is formed by an NMOS transistor Mm. The transistor Mm has the drain terminal connected to the current generator 140 (for receiving the comparison current Icomp); the transistor Mm has the gate terminal short-circuited to its drain terminal, and the source terminal connected to the ground terminal.

The current mirror 610 further includes an output leg for the selected cell. Particularly, the output leg is formed by an NMOS transistor Ms that has the gate terminal connected to the gate terminal of the transistor Mm and the source terminal connected to the ground terminal. The drain terminal of the transistor Ms is connected to the inverting input terminal of the comparator 205c. The transistors Mm and Ms are dimensioned so that a mirroring factor between the input leg and the output leg defined by the transistor Ms is $\lambda=1$. Therefore, the comparator 205c will receive the same comparison current Icomp.

The current mirror 610 further includes a pair of output legs for each reference cell. Particularly, each pair of output legs is formed by two NMOS transistors $Ms_i$ and $Mv_i$. All the transistors $Ms_i$, $Mv_i$ have the gate terminals connected to the gate terminal of the transistor Mm, and the source terminals connected to the ground terminal. The drain terminal of each transistor $Ms_i$ is connected to the inverting input terminal of the corresponding comparator $250r_i$ by means of a switch $615i$; likewise, the drain terminal of each transistor $Mv_i$ is connected to the inverting input terminal of the corresponding comparator $250r_i$ by means of a further switch $620_i$. The switches $620_i$ are controlled by the same enabling signal EN, while the switches $615_i$ are controlled by its negated value $\overline{EN}$.

The transistors of the current mirror 610 are dimensioned so that a mirroring factor between the input leg and the output legs defined by the transistors $Ms_i$ is $\lambda=1$; conversely, the mirroring factor between the input leg and the output legs defined by the transistors $Mv_i$ is lower than 1 (for example, $\lambda=0.5$-$0.7$). Therefore, the comparators $205r_i$ will receive a mirrored current (denoted with Icm), which is equal to the comparison current Icomp when supplied by the transistors $Ms_i$ or higher than it (Icm=Icomp/$\lambda$) when supplied by the transistors $Mv_i$.

Figure 6B:
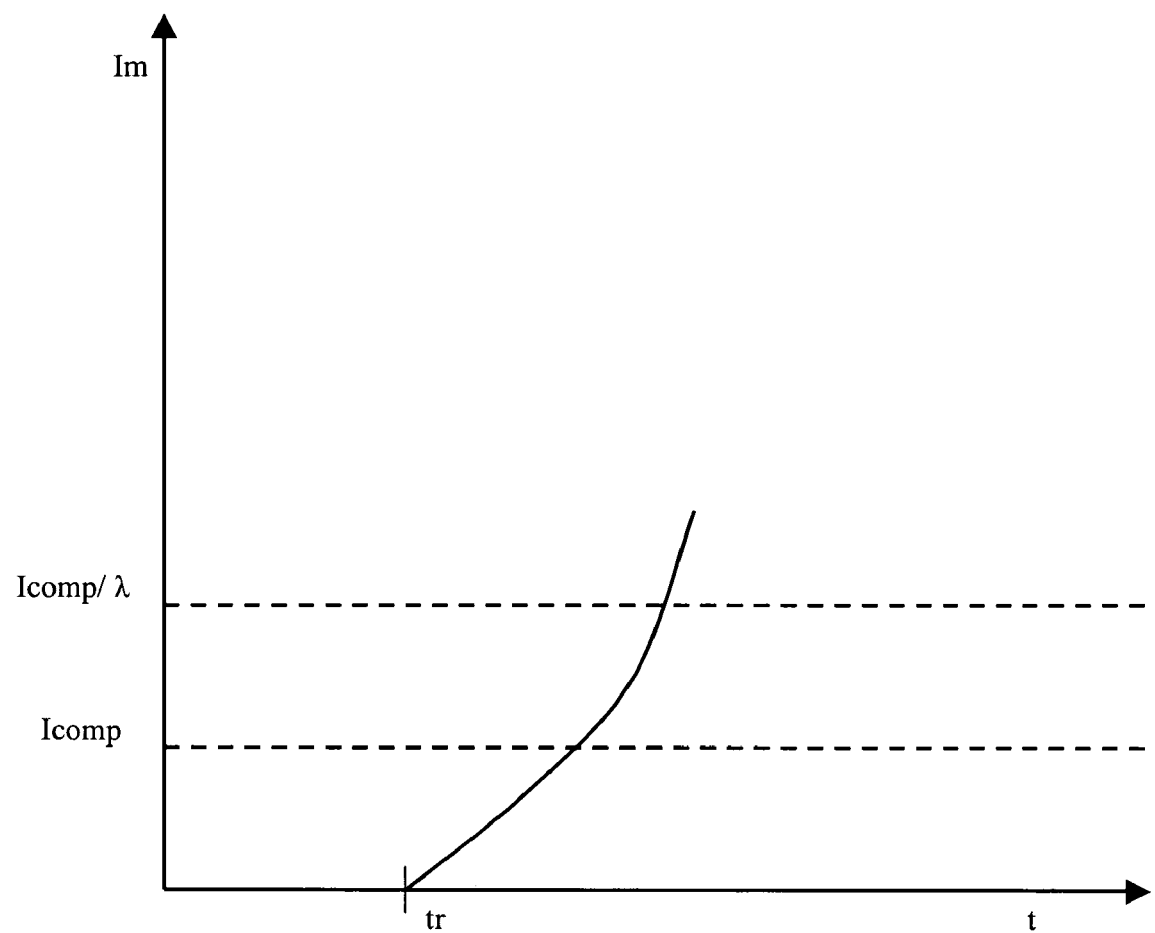
FIG. 6b is an illustrative time diagram explaining operation of the fourth embodiment of the invention.

Considering now FIGS. 6a and 6b together, the operation of the above-described structure is described with respect to a generic reference cell (omitting the corresponding indexes).

During the read operation, the enabling signal EN is deasserted; as a result, the switch 615 is closed and the switch 620 is open. In this condition, the mirrored current Icm is equal to the comparison current Icomp. Therefore, when the biasing voltage reaches the threshold voltage of the reference cell at the time tr, the reference cell turns on; therefore, as soon as the measure reference current Im reaches the mirrored current Icm=Icomp, its conduction bit is asserted.

Conversely, during the program-verify operation the enabling signal EN is asserted; therefore, the switch 615 is open and the switch 620 is closed. As a result, the mirrored current Icm=Icomp/$\lambda$ will be higher. This causes a corresponding delay in the reaching of the mirrored current Icm by the measure reference current Im; the delay is equivalent to an increase of the threshold voltage of the reference cell.

Naturally, in order to satisfy local and specific requirements, a person skilled in the art may apply to the solution described above many modifications and alterations. Particularly, although the present invention has been described with a certain degree of particularity with reference to preferred embodiments thereof, it should be understood that various omissions, substitutions and changes in the form and details as well as other embodiments are possible; moreover, it is expressly intended that specific elements and/or method steps described in connection with any disclosed embodiment of the invention may be incorporated in any other embodiment as a general matter of design choice.

For example, similar considerations apply if the memory device has a different structure or includes equivalent components. In addition, the application of the proposed solution to different non-volatile memory devices (such as $E^2$PROMs, flash memories with a NAND architecture, phase-change memories), or even to other memory devices (such as DRAMs) is contemplated; in any case, the principles of the invention should not be limited to a multi-level memory device (but they also apply to standard memory devices wherein each memory cell stores a single bit and then only one reference cell is provided).

Moreover, it is possible to use a biasing current that is not constant so as to obtain a biasing voltage having any desired monotonic time pattern (either increasing or decreasing over time).

Embodiments of the invention may also be suitable to be implemented by using other means for unbalancing the equivalent resistance and/or the equivalent capacitance of the path including the reference cells with respect to the ones of the path including each memory cell (for example, connecting the unbalancing capacitors and/or resistors in series).

Similar considerations apply if equivalent delay means is envisaged (for the logic start signal).

It is also possible to use different structures for updating either the measure reference currents or the comparison current.

The enabling/disabling of the proposed structure with equivalent techniques is contemplated; the same solution is also applicable to a refresh-operation, or more generally to any other read operation with a (positive and/or negative) margin.

Moreover, it will be apparent to those skilled in the art that the additional features providing further advantages are not essential for carrying out the invention, and may be omitted or replaced with different features.

For example, an implementation with a standard ramp generator (being not based on any current generator) is not excluded.

Moreover, it is also possible to modify the equivalent capacitance or the equivalent resistance only; alternatively, it is within the scope of the invention the possibility of updating the equivalent capacitance and/or resistance of the paths including the memory cells (even if it may be far less advantageous).

Alternatively, in a different embodiment of the invention the application of the biasing voltage to the memory cells is delayed.

In any case, the desired result can also be achieved by delaying the application of the biasing current to the desired path.

Nothing prevents the updating of the currents corresponding to the memory cells (instead of the ones corresponding to the reference cells), even if this implementation may be less advantageous.

Likewise, it is possible to update the current that is compared with the currents flowing through the memory cells (with the same problems pointed out above).

Moreover, any combinations of the above-described solutions are feasible.

It should be noted that although in the preceding description reference has been made to a read operation and to a program-verify operation, this is not to be intended as a limitation; indeed, the same techniques can also be applied to emulate different reference cells (for example, for reading other logical values). In other words, it is conceivable a multi-level memory device with a single reference cell from which all the other reference cells are derived.

A memory having any of the read/program verify circuits disclosed in conjunction with FIGS. 3a, 4a, 5a, and 6a may be disposed on an integrated circuit (IC), such as a non-volatile memory IC or processor having an embedded memory. And such an IC may be disposed in a system such as a computer system.

From the foregoing it will be appreciated that, although specific embodiments of the invention have been described herein for purposes of illustration, various modifications may be made without deviating from the spirit and scope of the invention.

What is claimed is:

1. A memory device including a plurality of memory cells, means for comparing a set of selected memory cells with at least one reference cell having a predefined threshold voltage, the means for comparing including biasing means for applying a biasing voltage having a substantially monotonic time pattern to the selected memory cells and the at least one reference cell, means for detecting the reaching of a comparison current by a measure cell current corresponding to each selected memory cell and by a measure reference current corresponding to each reference cell, and means for determining a condition of each selected memory cell according to a temporal relation of the reaching of the comparison current by the corresponding measure cell current and by the as least one measure reference current, wherein the means for comparing further includes means for selectively modifying at least one of said currents to emulate the comparison with at least one further reference cell having a further threshold voltage.

2. The memory device according to claim 1, wherein the biasing means includes means for applying a biasing current to a set of first paths and to a second path, each first path including the selected memory cell and the second path including the at least one reference cell.

3. The memory device according to claim 2, wherein the means for selectively modifying includes means for unbalancing an equivalent resistance of the second path with respect to an equivalent resistance of each first second path.

4. The memory device according to claim 2 wherein the means for selectively modifying includes means for unbalancing an equivalent capacitance of the second path with respect to an equivalent capacitance of each first path.

5. The memory device according to claim 1 wherein the means for selectively modifying includes means for delaying the application of the biasing voltage to the at least one reference cell.

6. The memory device according to claim 5, wherein the biasing means is responsive to an enabling signal, the means for delaying the application of the biasing voltage including means for delaying the enabling signal.

7. The memory device according to claim 1 wherein the means for selectively modifying includes means for obtaining each measure reference current by combining a current flowing through the corresponding reference cell with an adjusting current.

8. The memory device according to claim 1 wherein the means for selectively modifying includes means for updating the comparison current.

9. The memory device according to claim 1, further including means for disabling the means for selectively modifying during a read operation of the selected memory cells and for enabling the means for selectively modifying during at least one read operation with a margin of the selected memory cells.

10. A read circuit operable to read a memory cell storing a data value, the circuit comprising:
   a sense amplifier operable to
      detect when a data signal from the memory cell achieves a first predetermined relationship to a first comparison signal,
      detect when a reference signal from a reference cell achieves a second predetermined relationship to a second comparison signal, and
      identify the data value stored in the memory cell by determining an order in which the data signal and reference signal respectively achieve the first and second predetermined relationships to the first and second comparison signals; and
   a modifier operable to modify a time at which the reference signal achieves the second predetermined relationship to the second comparison signal.

11. The read circuit of claim 10 wherein:
   the data signal achieves the first predetermined relationship to the first comparison signal when the data signal becomes greater than the first comparison signal; and the reference signal achieves the second predetermined relationship to the second comparison signal when the reference data signal becomes greater than the second comparison signal.

12. The read circuit of claim 10 wherein the first comparison signal is substantially equal to the second comparison signal.

13. The read circuit of claim 10 wherein the modifier is operable to modify the time at which the reference signal achieves the second predetermined relationship to the second comparison signal by:
   generating a modified read signal having substantially the same slope as a read signal that drives the memory cell and having an amplitude that is offset from an amplitude of the read signal; and
   driving the reference cell with the modified read signal.

14. The read circuit of claim 10 wherein the modifier is operable to modify the time at which the reference signal achieves the second predetermined relationship to the signal comparison signal by:
   generating from a first portion of a bias signal a modified read signal having substantially the same slope as and having a different amplitude than a read signal that is generated from a second portion of the bias signal and that drives the memory cell; and
   driving the reference cell with the modified read signal.

15. The read circuit of claim 10 wherein the modifier is operable to modify the time at which the reference signal achieves the second predetermined relationship to the second comparison signal by:
   delaying a start signal in response to which is generated a read signal that drives the memory cell;
   generating in response to the delay start signal a modified read signal having substantially the same slope and the same amplitude as the read signal; and
   driving the reference cell with the modified read signal.

16. The read circuit of claim 10 wherein the modifier is operable to modify the time at which the reference signal achieves the second predetermined relationship to the second comparison signal by:
   generating a modifying signal; and
   combining the modifying signal with a raw reference signal from the reference cell to generate the reference signal.

17. The read circuit of claim 10 wherein the modifier is operable to modify the time at which the reference signal achieves the second predetermined relationship to the second comparison signal by generating the second comparison signal unequal to the first comparison signal.

18. An integrated circuit, comprising:
   a memory cell operable to store a data value and to generate a data signal that represents the data value;
   a reference cell operable to generate a reference signal;
   a sense amplifier coupled to the memory and reference cells and operable to detect when the data signal from the memory cell achieves a first predetermined relationship to a first comparison signal,
   detect when the reference signal from the reference cell achieves a second predetermined relationship to a second comparison signal, and
   identify the data value stored in the memory cell by determining an order in which the data signal and reference signal respectively achieve the first and second predetermined relationships to the first and second comparison signals; and
   a modifier operable to modify a time at which the reference signal achieves the second predetermined relationship to the second comparison signal.

19. A system, comprising:
   an integrated circuit comprising,
      a memory cell operable to store data value and to generate a data signal that represents the data value;
      a reference cell operable to generate a reference signal;
      a sense amplifier coupled to the memory and reference cells and operable to detect when the data signal from the memory cell achieves a first predetermined relationship to a first comparison signal,
      detect when the reference signal from the reference cell achieves a second predetermined relationship to a second comparison signal,
      identify the data value stored in the memory cell by determining an order in which the data signal and reference signal respectively achieve the first and second predetermined relationships to the first and second comparison signals; and
      a modifier operable to modify a time at which the reference signal achieves the second predetermined relationship to the second comparison signal.

\* \* \* \* \*